United States Patent
Beach et al.

(10) Patent No.: US 7,564,235 B2
(45) Date of Patent: Jul. 21, 2009

(54) DETERMINATION OF MAGNETIC READ HEAD PROPERTIES

(75) Inventors: Robert S. Beach, Los Gatos, CA (US); Arley C. Marley, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 511 days.

(21) Appl. No.: 11/464,050

(22) Filed: Aug. 11, 2006

(65) Prior Publication Data

US 2008/0036455 A1 Feb. 14, 2008

(51) Int. Cl.
*G01R 33/00* (2006.01)
*G01R 33/09* (2006.01)
*G11B 5/33* (2006.01)

(52) U.S. Cl. ............... 324/210; 360/324; 360/324.2

(58) Field of Classification Search ............ 324/207.21, 324/210–213, 252; 360/313–318, 324–327, 360/324.2
See application file for complete search history.

(56) References Cited

U.S. PATENT DOCUMENTS

| | | | |
|---|---|---|---|
| 5,876,264 A | 3/1999 | Church et al. | |
| 6,166,536 A * | 12/2000 | Chen et al. ............... | 324/212 |
| 6,473,257 B1 | 10/2002 | Shimazawa et al. | |
| 6,513,227 B2 | 2/2003 | Santini | |
| 6,515,475 B2 | 2/2003 | Goubau et al. | |
| 6,563,682 B1 * | 5/2003 | Sugawara et al. ........ | 360/324.2 |
| 6,642,713 B2 | 11/2003 | Diederich | |
| 6,667,613 B1 | 12/2003 | Mitsunaga | |
| 6,667,862 B2 * | 12/2003 | Zhu ....................... | 360/324.12 |
| 6,684,171 B2 | 1/2004 | Church et al. | |
| 6,707,294 B2 | 3/2004 | Takano | |
| 6,724,582 B2 | 4/2004 | Funayama et al. | |
| 6,731,110 B2 | 5/2004 | Church | |
| 6,751,073 B2 | 6/2004 | Hasegawa | |
| 6,762,914 B2 | 7/2004 | Fox et al. | |
| 6,927,569 B2 | 8/2005 | Worledge et al. | |
| 7,369,375 B2 * | 5/2008 | Hayashi et al. ......... | 360/324.12 |
| 2005/0195648 A1 | 9/2005 | Saruki et al. | |
| 2005/0237789 A1 | 10/2005 | Saruki et al. | |

FOREIGN PATENT DOCUMENTS

| | | |
|---|---|---|
| JP | 11296824 | 10/1999 |
| JP | 2000276722 | 10/2000 |
| JP | 2005056515 | 3/2005 |

* cited by examiner

*Primary Examiner*—Bot LeDynh
(74) *Attorney, Agent, or Firm*—Patterson & Sheridan, L.L.P.

(57) ABSTRACT

A method, computer-readable medium, and apparatus for measuring properties of a magnetic read head are provided. In one embodiment, the method includes providing a first and a second magnetic read head. A first dimension of the first magnetic read head is different from a corresponding first dimension of the second magnetic read head. The method further includes determining a first change in conductance of the first magnetic read head resulting from an applied magnetic field and a second change in conductance of the second magnetic read head resulting from the applied magnetic field. The first change in conductance and the second change in conductance are used to determine a change in the first dimension and the corresponding first dimension of the first and second magnetic read heads, respectively. The change in the first dimension and the corresponding first dimension results from a manufacturing process of the first and second magnetic read heads.

24 Claims, 12 Drawing Sheets

USING MINIMUM ($G_{MIN}$) AND MAXIMUM ($G_{MAX}$) CONDUCTANCES FOR A PLURALITY OF ACTIVE TRACK WIDTHS (w + δw) AND ACTIVE STRIPE HEIGHTS (h + δh), CALCULATE INVERSE OF PERCENT CHANGE IN CONDUCTANCE VALUES ($G_{MIN}/\Delta G$) FOR THE PLURALITY OF ACTIVE TRACK WIDTHS (w + δw) AND ACTIVE STRIPE HEIGHTS (h + δh) — 902

USING INVERSE PERCENT CHANGE IN CONDUCTANCE VALUES ($G_{MIN}/\Delta G$), TAKE THE LIMIT AS THE PLURALITY OF TRACK WIDTHS APPROACH INFINITY (w + δw → ∞) AND THE LIMIT AS THE PLURALITY OF STRIPE HEIGHTS APPROACH INFINITY (h + δh → ∞) TO DETERMINE THE INTRINSIC RESISTANCE AREA (RA) FOR THE MAGNETIC READ HEAD — 904

FIG. 9

DETERMINATION OF MAGNETIC READ HEAD PROPERTIES

BACKGROUND OF THE INVENTION

1. Field of the Invention

Embodiments of the present invention generally relate to a method, computer-readable medium, and system for determining properties of a magnetic read head.

2. Description of the Related Art

Modern computer systems typically include a hard drive which may be used as mass storage for the computer system. Information in the hard drive is typically stored as magnetic charge on one or more magnetic disks within the hard drive. To read the information, the hard drive includes a magnetic read head which senses the magnetic charge as the magnetic disks spin beneath the read head.

Modern magnetic read heads typically include several layers of material deposited on a substrate. As the magnetic read head passes over an area of a magnetic disk in which a magnetic charge is present, the magnetic charge may induce a detectable change in the layers of material in the magnetic read head. For example, during a read operation, a current may be applied to the layers of material in the magnetic read head. In some cases, the current may be applied perpendicular to the layers of material in the magnetic read head. Where the current is applied perpendicular to the layers of material in the magnetic read head (e.g., perpendicular to the plane of the layers of material), the read head may be referred to as a current-perpendicular to plane (CPP) magnetic read head.

The current applied to the layers of material may create a voltage across the layers of material which is proportional the resistance of the layers of material. As the head passes over a magnetic charge on the magnetic disk, the magnetic charge may cause a change in the combined resistance of the layers of material (e.g., an increase or decrease in the resistance of the layers of material). The stored magnetic charge may then be measured via a corresponding change in the voltage across the layers of material (e.g., a corresponding increase or decrease in the voltage resulting from the current applied to the layers of material).

In order to ensure proper design of the hard drive for reading magnetic charges stored on the magnetic disk, there may be a desire to measure certain properties of the magnetic read head. For example, the magnetic read head may have an active strip height and an active track width which indicate the area of the magnetic read head which is affected by magnetic charge stored on the magnetic disk. Other measurable properties of the magnetic read head may include intrinsic properties of the magnetic read head such as the minimum resistance of the layers of the magnetic read head and the percent change in resistance of the layers of the magnetic read head between the minimum and maximum resistance due, e.g., to the alignment of the magnetic moments of the free layer and the pinned layer as described below.

While the magnetic read head may be designed and manufactured according to specified values of given properties of the magnetic read head (referred to as nominal values, e.g., nominal active stripe height and nominal active track width), the resulting manufactured magnetic read head typically deviates from such nominal design values, for example, due to imperfections in the manufacturing process. As an example, during manufacturing of a CPP magnetic read head, the sides of the magnetic read head may be milled to obtain a magnetic read head with a track width and stripe height close to a specified nominal value. During milling of the sides of the magnetic read head, the material being milled (e.g., material from the layers of the magnetic read head) may be redeposited along the sides of the magnetic read head. Such redeposited material is referred to herein as shunting material because the shunting material creates a shunt (e.g., an alternate current path) along the sides of the CPP magnetic read head.

In some cases, the shunting material may be magnetically dead, such that the material is insensitive to changes in magnetization of the magnetic read head, (e.g., due to the presence of a stored magnetic charge), thereby decreasing the sensitivity of the magnetic read head. Also, the milling process may cause damage to the layers of the magnetic read head, further changing the properties of the magnetic read head from the nominal design values and decreasing the sensitivity of the magnetic read head. The presence of such imperfections in the manufacturing process may make measurement of properties of the magnetic read head (e.g., active track width, active track height, minimum resistance, and percent change in resistance) difficult, thereby complicating proper design of the hard drive.

Accordingly, what is needed is an improved method, computer readable medium, and system for determining properties of a magnetic read head.

SUMMARY OF THE INVENTION

Embodiments of the present invention generally provide a method, computer-readable medium, and system for determining properties of a magnetic read head. In one embodiment, the method includes providing a first and a second magnetic read head. A first dimension of the first magnetic read head may be different from a corresponding first dimension of the second magnetic read head. The method further includes determining a first change in conductance of the first magnetic read head resulting from an applied magnetic field and a second change in conductance of the second magnetic read head resulting from the applied magnetic field. The first change in conductance and the second change in conductance may be used to determine a change in the first dimension and the corresponding first dimension of the first and second magnetic read heads, respectively. The change in the first dimension and the corresponding first dimension may result from a manufacturing process of the first and second magnetic read heads.

One embodiment of the invention provides a computer readable medium including instructions which, when executed by a processor, perform a method for measuring properties of a magnetic read head. In one embodiment, the method includes receiving test data for a first and a second magnetic read head. A first dimension of the first magnetic read head may be different from a corresponding first dimension of the second magnetic read head. The method further includes determining from the test data a first change in conductance of the first magnetic read head resulting from an applied magnetic field and a second change in conductance of the second magnetic read head resulting from the applied magnetic field. The method also includes using the first change in conductance and the second change in conductance to determine a change in the first dimension and the corresponding first dimension of the first and second magnetic read heads, respectively. The change in the first dimension and the corresponding first dimension may result from a manufacturing process of the first and second magnetic read heads.

One embodiment of the invention provides a system including a computer readable medium including a program and a processor. The processor, when executing the program, may receive test data for a first and a second magnetic read head. A first dimension of the first magnetic read head may be different from a corresponding first dimension of the second magnetic read head. The processor may also determine from the test data a first change in conductance of the first magnetic read head resulting from an applied magnetic field and a second change in conductance of the second magnetic read head resulting from the applied magnetic field. The processor may also use the first change in conductance and the second change in conductance to determine a change in the first dimension and the corresponding first dimension of the first and second magnetic read heads, respectively. The change in the first dimension and the corresponding first dimension may result from a manufacturing process of the first and second magnetic read heads.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9 is a flow diagram depicting an exemplary method for determining resistance properties of a magnetic read head according to one embodiment of the invention.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Embodiments of the invention provide a method, computer-readable medium, and system for determining properties of a magnetic read head. In one embodiment, the method includes providing a first and a second magnetic read head. A first dimension of the first magnetic read head may be different from a corresponding first dimension of the second magnetic read head. The method further includes determining a first change in conductance of the first magnetic read head resulting from an applied magnetic field and a second change in conductance of the second magnetic read head resulting from the applied magnetic field. The first change in conductance and the second change in conductance are used to determine a change in the first dimension and the corresponding first dimension of the first and second magnetic read heads, respectively. The change in the first dimension and the corresponding first dimension results from a manufacturing process of the first and second magnetic read heads.

An Exemplary Hard Drive

Figure 1:
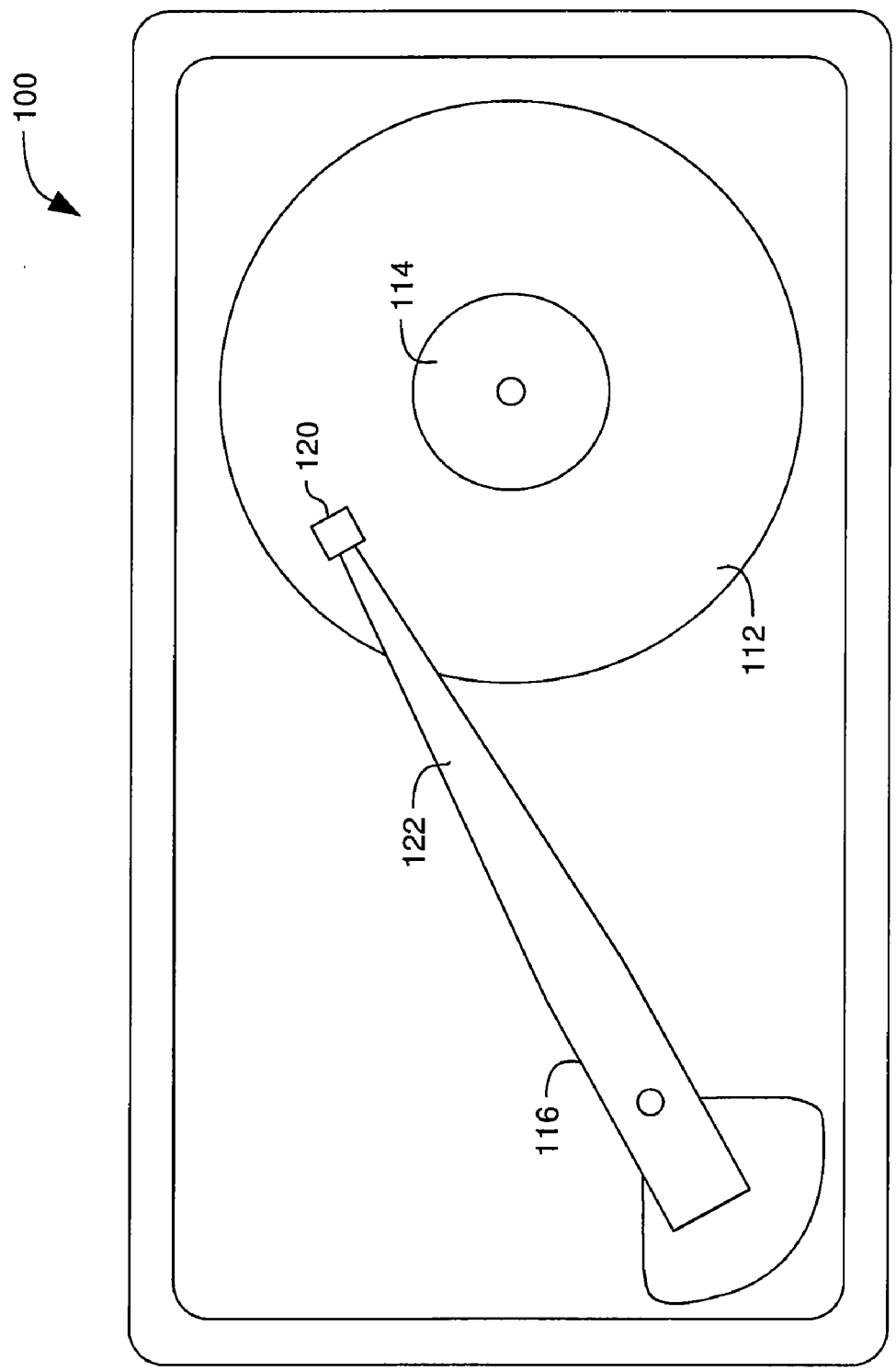
FIG. 1 is a block diagram depicting a hard drive according to one embodiment of the invention.

FIG. 1 is a block diagram depicting a hard drive 100 according to one embodiment of the invention. The hard disk drive 100 includes a magnetic media hard disk 112 mounted upon a motorized spindle 114. An actuator arm 116 is pivotally mounted within the hard disk drive 100 with a slider 120 disposed upon a distal end 122 of the actuator arm 116. During operation of the hard disk drive 100, the hard disk 112 rotates upon the spindle 114 and the slider 120 acts as an air bearing surface (ABS) adapted for flying above the surface of the disk 112. The slider 120 includes a substrate base upon which various layers and structures that form a magnetic reader are fabricated.

An Exemplary Magnetic Read Head

Figure 2A:
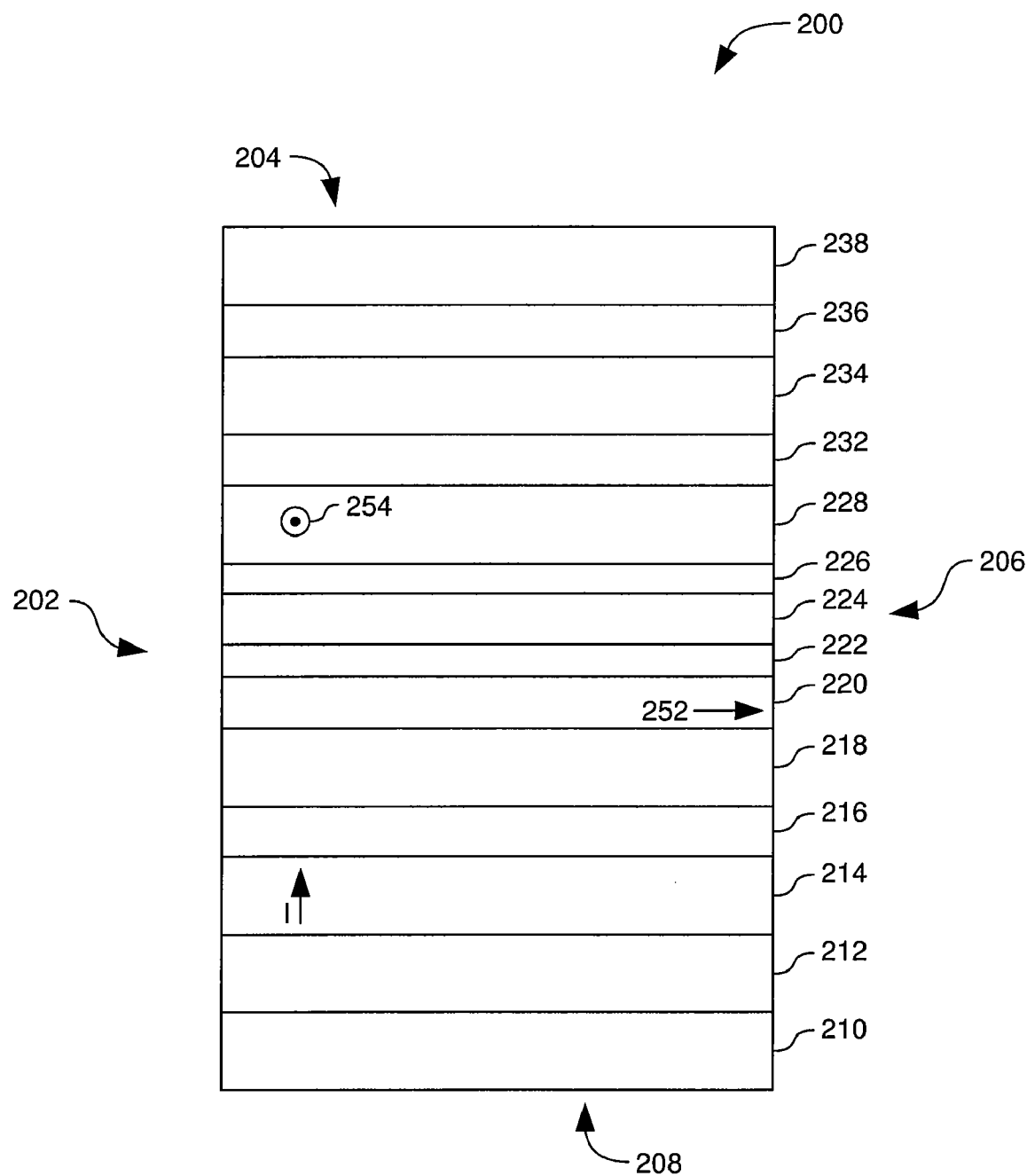
FIGS. 2A and 2B are block diagrams depicting an exemplary magnetic read head according to one embodiment of the invention.

FIG. 2A is a block diagram depicting layers of an exemplary magnetic read head 200 according to one embodiment of the invention. In the depicted embodiment, a tunneling magnetoresistive (TMR) read head is shown in which current I tunneling through a tunneling barrier layer 226 is affected by the alignment of a magnetic moment 254 in a free layer 240 (with a magnetic field 254 which may be changed, e.g., due a magnetic charge stored on a disk 112) and a pinned layer 220 (with a magnetic moment 252 which is pinned to a given alignment by an antiferromagnetic (AFM) pinning layer 218). In one embodiment, the magnetic read head 200 may be referred to as a current perpendicular to plane (CPP) magnetic read head 200 because the current I may flow perpendicular to the layers of material within the magnetic read head 200. The magnetic read head 200 may have a bottom side 208, top side 204, a side 202 which acts as an air bearing surface (ABS), and a back surface 206 opposite from the ABS side 202.

As depicted, the magnetic read head 200 may include a substrate 210 and an initial underlayer 212. A first magnetic shield layer S1 may be plated on the underlayer 212 and a Tantalum (Ta) and/or Ruthenium (Ru) spacer layer may be deposited on the shield layer 214. A pinning layer 218 may then be deposited on the Ta/Ru spacer layer 216, followed by a pinned layer 220. In one embodiment, the pinned layer 220 may be about 25 angstroms (Å) thick. The pinned layer may be formed from Cobalt-Iron (CoFe) or any other appropriate material. The pinning layer 218 may fix the direction of a magnetization 252 of the pinned layer 220 substantially in a direction directed from right to left or from left to right. The pinning layer may be formed from Iridium-Manganese-Chromium (IrMnCr), Platinum-Manganese (PtMn) or any other appropriate pinning material.

On the pinned layer 220, another Ru spacer layer 222 may be deposited, followed by a reference layer 224 which may be formed, for example, from Cobalt-Iron-Boron (CoFeB) or any other appropriate material. In one embodiment, the reference layer 224 may be about 20 Å thick. A tunneling barrier layer 226 may be deposited on the reference layer 224. The tunneling barrier layer 226 may be formed, for example, from Magnesium-Oxide (MgO).

A free layer 228 may then be deposited on the tunneling barrier layer 226. In some cases, the free layer 228 may include multiple layers which form the free layer 228. The free layer 228 may provide a magnetic moment 254 directed either out of the head 200 or into the head 200. Other spacer layers 232, 234 may be deposited on the free layer 2228 followed by a lead layer 236 and a second shield layer S2 238 which is plated on the lead layer 236. In general, the depicted layers are exemplary layers and a read head 200 may, in some cases, contain more layers or fewer layers at different thicknesses as known to those skilled in the art. Similarly, materials other than those shown may be used for given layers as known to those skilled in the art.

Figure 2B:
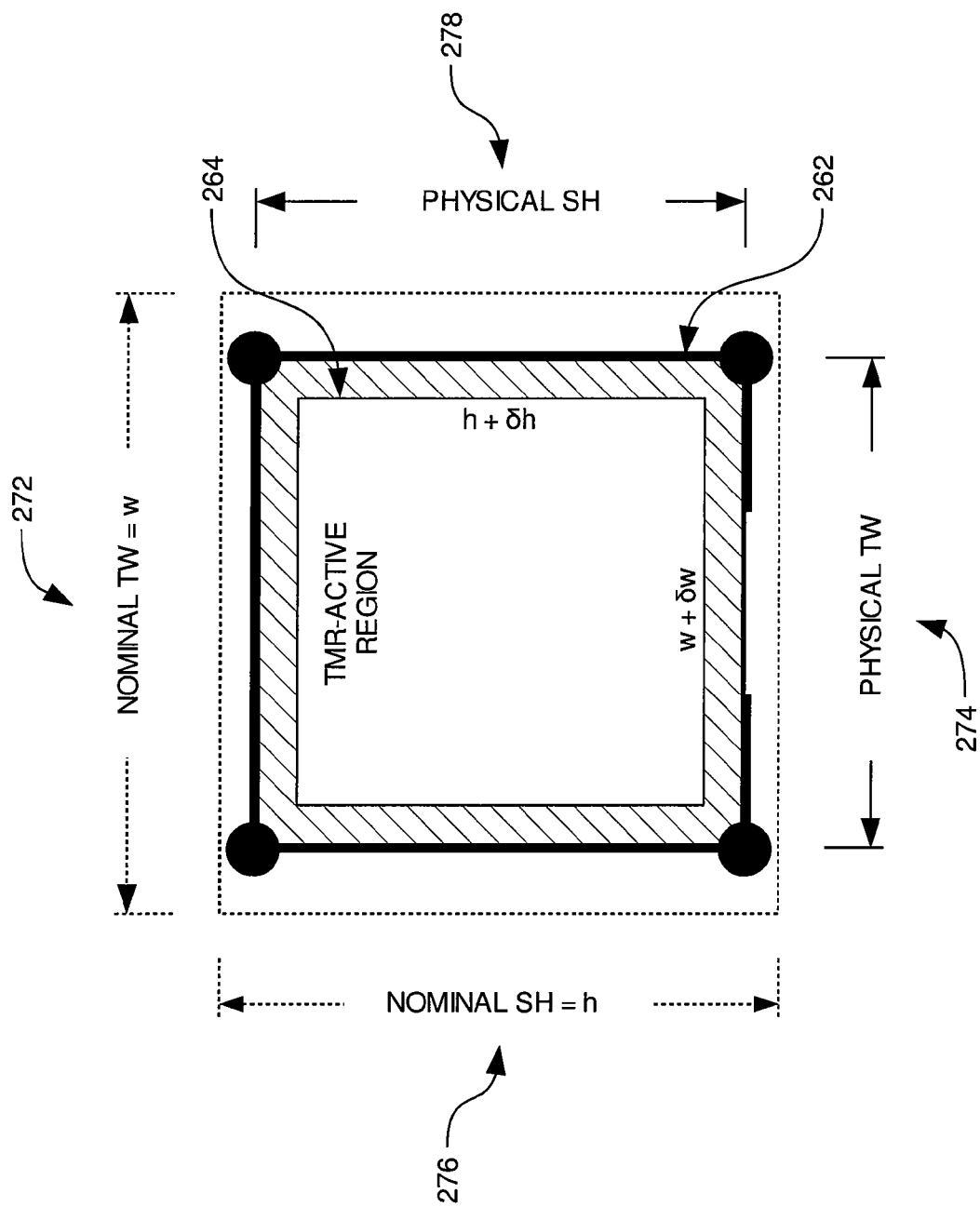

FIG. 2B is a block diagram depicting a top view of the layers of the magnetic read head 200 according to one embodiment of the invention. As depicted, the magnetic read head 200 may have a nominal track width (w) and a nominal stripe height (h). The nominal values may, for example, be the designed track width values and designed stripe height values for the magnetic read head 200 (e.g., as opposed to the manufactured track width and stripe height). However, due to imperfections in the manufacturing process, the actual physical track width and physical stripe height may differ from the nominal values. Furthermore, as described above, due to redeposition of material 264 and damage to material 262 along the sides (e.g., to the top and bottom sides 272, 274 and lateral sides 276, 278) of the magnetic read head 200 during milling, the edges of the magnetic read head 200 may have material 262, 264 which is magnetically dead (e.g., insensitive to changes in a magnetic field) such that the active track width (w+δw) and active stripe height (h+δh) may differ from the nominal track width and nominal stripe height, where δw and δh are the respective differences.

In one embodiment of the invention, the conductance (e.g., the inverse of the resistance) of the magnetic read head 200 may be maximized where the magnetic moment 254 of the free layer 228 is aligned parallel to the magnetic moment 252 of the pinned layer 220 (e.g., when an external field present in the magnetic disk 12 forces parallel alignment of the layers). Where the conductance is maximized, the conductance may be expressed as depicted in Formula 1:

$$G_{MAX}=[(w+\delta w)(h+\delta h)/\rho]+2(w+\delta w)\times S_{K3}+2(h+\delta h)^{*}S_{K5}+4S_{C}$$ Formula 1 where ρ (rho) is the inherent resistance-area product (RA) of the layers of the magnetic read head 200, $S_{K3}$ is the linear conductance (per unit length) of the top side 272 or bottom side 274, $S_{K5}$ is the linear conductance of one or the lateral sides 276, 278, and $S_C$ is the conductance of one of the corners of the magnetic read head 200. When a magnetic field is applied which changes the alignment of the magnetic field 254 of the free layer 228 to a direction antiparallel to the magnetic field 252 of the pinned layer 220, the resistance of the magnetic read head 200 may be maximized, resulting the in the minimum conductance as depicted in Formula 2:

$$G_{MIN}=[(w+\delta w)(h+\delta h)/(\rho^{*}(1+t))]+2(w+\delta w)\times S_{K3}+2(h+\delta h)^{*}S_{K5}+4S_{C}$$ Formula 2

As depicted, the formula for the minimum conductance is similar to the formula for the maximum conductance, but the minimum conductance is scaled by the factor (1+t) where t is the intrinsic magnetoresistance (MR) value of the active layers of the magnetic read head 200. The MR value t is typically expressed as a percentage and defined as the change in resistance ($\Delta R=R_{MAX}-R_{MIN}$) of the magnetic read head 200 resulting from an applied magnetic field divided by the minimum resistance ($R_{MIN}$) of the magnetic read head 200 (e.g., when an external field forces parallel alignment of the layers) as depicted in Formula 3.

$$t=(R_{MAX}-R_{MIN})/R_{MIN}$$ Formula 3

The MR value t is indicative of the sensitivity of the magnetic read head 200. If the change in the intrinsic resistance of the active layers of the magnetic read head 200 due to an applied magnetic field is large (resulting in a large MR value t), then the resulting change in voltage of the magnetic read head 200 may be larger and may thus be detected easier than if the change in resistance and voltage is smaller.

Furthermore, as depicted in Formulas 1 and 2, the resistance/conductance of the shunting material 262, 264 (the $S_{K3}$, $S_{K5}$, and $S_C$ terms in Formulas 1 and 2) may not be affected by a change in the magnetic field applied to the magnetic read head 200. Thus, as described above, the shunting material 262, 264 may be magnetically inactive (also referred to as magnetically dead). Also, by comparing Formulas 1 and 2, it may be shown that the shunting material 262, 264 may reduce sensitivity of the magnetic read head 200 because the change in conductance/resistance of the magnetic read head 200 relative to the minimum conductance of the magnetic read head 200 (referred to as the effective MR value $t_E$) may be smaller than the intrinsic (e.g., exclusive of the shunting material 262, 264) MR value t. In one embodiment, $t_E$ may be calculated as depicted in Formula 4:

$$t_E=(G_{MAX}-G_{MIN})/G_{MIN}$$ Formula 4

As described above, to improve design of the magnetic read head 200 and the hard drive 100, it may be desired to accurately determine properties of the magnetic read head 200 such as the active track width (w+δw), active stripe height (h+δh), resistance of the shunting material 262, 264 ($S_{K3}$, $S_{K5}$, and $S_C$), intrinsic resistance area (ρ=RA), and intrinsic MR value (t) of the magnetic read head 200. Embodiments for measuring the properties of the magnetic read head 200 are described below with respect to FIGS. 3-9.

An Exemplary Test System

Figure 3:
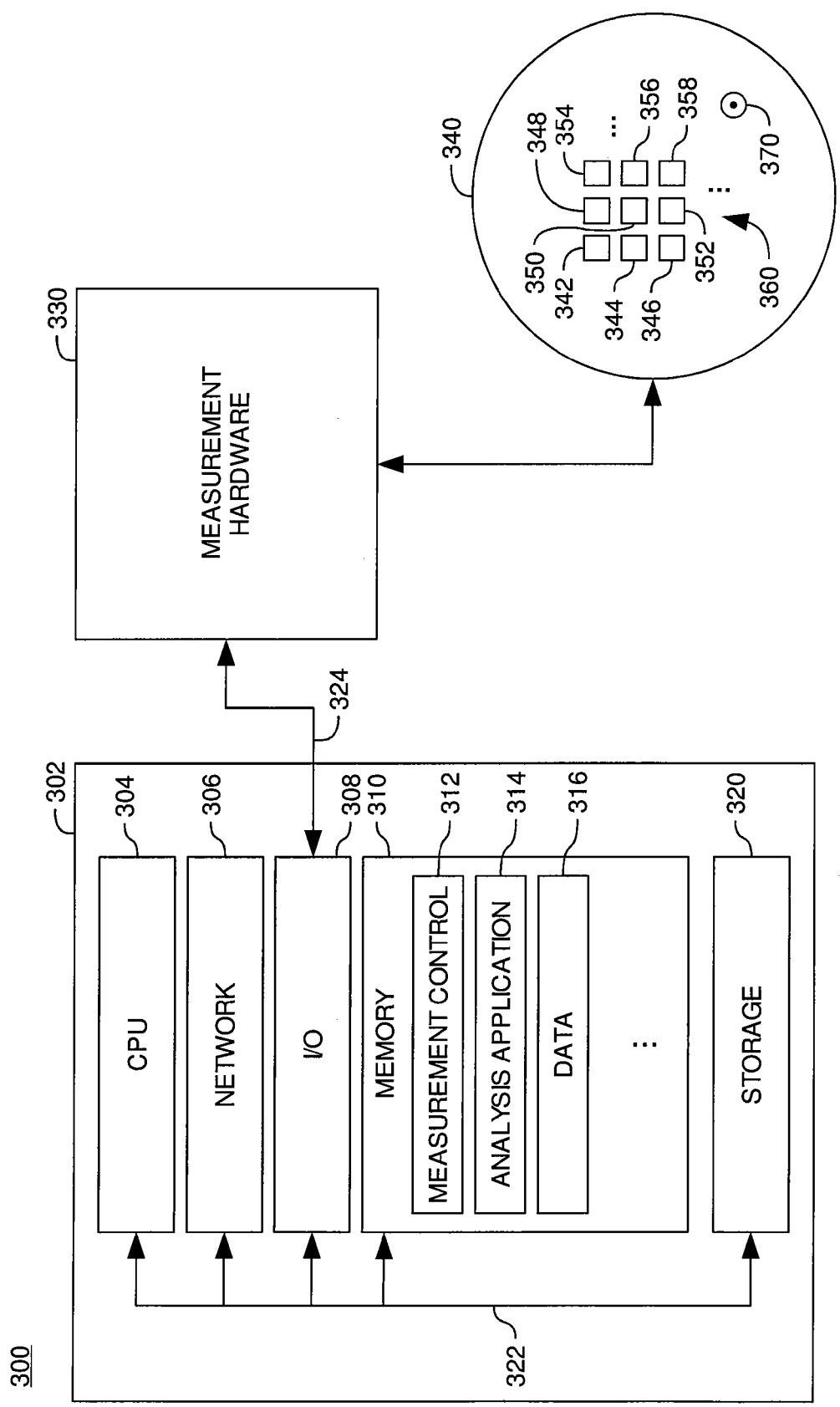
FIG. 3 is a block diagram depicting a test system according to one embodiment of the invention.

One embodiment of the invention is implemented as a program product for use with a system such as, for example, the test system 300 shown in FIG. 3 and described below. The program(s) of the program product defines functions of the embodiments (including the methods described herein) and can be contained on a variety of computer-readable media. Illustrative computer-readable media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive 100); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

As depicted, the system 300 may include a computer system 302, measurement hardware 330, and a test group 340 of magnetic read heads 360. In one embodiment, the test group 340 may contain a plurality of magnetic read heads 342, 344, 346, 348, 350, 352, 354, 356, 358 (collectively, magnetic read heads 360) which may be tested by the test system 300. In some cases, the test system 300 may be operated by the manufacturer of the test group 340. Optionally, the test system 300 or components of the test system 300 may be operated by a third party which performs testing of the test group 340. For example, a manufacturer may manufacture the test group 340, a second party may operate the measurement hardware 330, and a third party or the manufacturer may utilize the computer system 302 to analyze the measurements obtained with the measurement hardware 330.

In one embodiment, the measurement hardware 330 may be used to perform tests of the test group 340. For example, the measurement hardware 330 may be used to connect to the magnetic read head 360, apply a magnetic field 370 to the magnetic read heads 360, and measure properties of the magnetic read heads 360 such as the resistance/conductance of the magnetic read heads 360 in the applied magnetic field 370 or in the absence of the applied magnetic field 370. In some cases, the measurement hardware 330 may provide an interface which may be used to operate the measurement hardware 330. Optionally, the measurement hardware 330 may be controlled by a computer system such as the depicted computer system 302. The computer system 302 may communicate (e.g., commands and/or results/data) with the measurement hardware via a connection 324 which may be an Internet connection, intranet connection, serial port connection, USB port connection, wireless network connection, or any other appropriate connection or combination of connections.

In one embodiment, the computer system 302 may have an input/output (I/O) interface 308 (and/or a network interface 306) which may be used to communicate via the connection 324 to the measurement hardware 330. The interfaces 306, 308 may be controlled by a central processing unit 304 which may execute programs 312, 314 and process data 316 stored in memory 310. Programs and/or data may also be stored temporarily and/or permanently in storage 320. Each of the components (304, 306 etc.) may communicate via an internal communication bus 322.

In one embodiment of the invention, the computer system 302 may include a measurement control program 312 and an analysis application 314 which may be used to obtain and analyze data 316 received from the measurement hardware 330 after testing the magnetic read heads 360. In one embodiment, the analysis program 314 may be used to measure properties 360 of the magnetic read heads 360 as described below with respect to FIGS. 4-9.

Method for Measuring Properties of the Magnetic Read Head

In one embodiment of the invention, Formulas 1-2 described above may be used to determine values for a variety of properties of the magnetic read head 200. Also, in one embodiment, the determined properties of the magnetic read head 200 may be obtained using only conductance or resistance measurements provided by the measurement hardware 330 for a selected group of the magnetic read heads 360, some of which may, for example, be manufactured as variations of the magnetic read head 200, as described below. In one embodiment, each of the magnetic read heads 360 may have a nominal track width w and/or a nominal stripe height h which is varied from other magnetic read heads 360. For example, the magnetic read heads 360 may have nominal track widths and nominal stripe heights as depicted in Table 1.

TABLE 1

| Exemplary Magnetic Read Head Sizes | | |
|---|---|---|
| Magnetic Read Head | Width | Height |
| Read Head 342 | w1 | h1 |
| Read Head 344 | w1 | h2 |
| Read Head 346 | w1 | h3 |
| Read Head 348 | w2 | h1 |
| Read Head 350 | w2 | h2 |
| Read Head 352 | w2 | h3 |
| Read Head 354 | w3 | h1 |
| Read Head 356 | w3 | h2 |
| Read Head 358 | w3 | h3 |

Nominal track widths w1, w2, w3 and nominal stripe heights h1, h2, h3 of the magnetic read heads 360 may be any appropriate values. For example, the nominal track widths and nominal stripe heights may be values which are selected during manufacturing to provide a distribution of test data 316 which, when analyzed, provides an accurate measurement of properties of the magnetic read head 200. The nominal track widths and nominal stripe heights may include a spread of values which may be modified using settings for the manufacturing process used to manufacture the magnetic read heads 360 (for example, the manufacturing process may provide three different nominal track width settings and three different nominal stripe height settings which may be used to manufacture the magnetic read heads 306). Other appropriate manners of selecting of test values should be readily apparent to those skilled in the art.

In one embodiment of the invention, the determination of properties of the magnetic read head 200 may include providing a first and a second magnetic read head. A first dimension of the first magnetic read head may be different from a corresponding first dimension of the second magnetic read head. The determination may also include determining a first change in conductance of the first magnetic read head resulting from an applied magnetic field and a second change in conductance of the second magnetic read head resulting from the applied magnetic field. The first change in conductance and the second change in conductance may be used to determine a change in the first dimension and the corresponding first dimension of the first and second magnetic read heads, respectively. The change in the first dimension and the corresponding first dimension may result from a manufacturing process of the first and second magnetic read heads.

Figure 4:
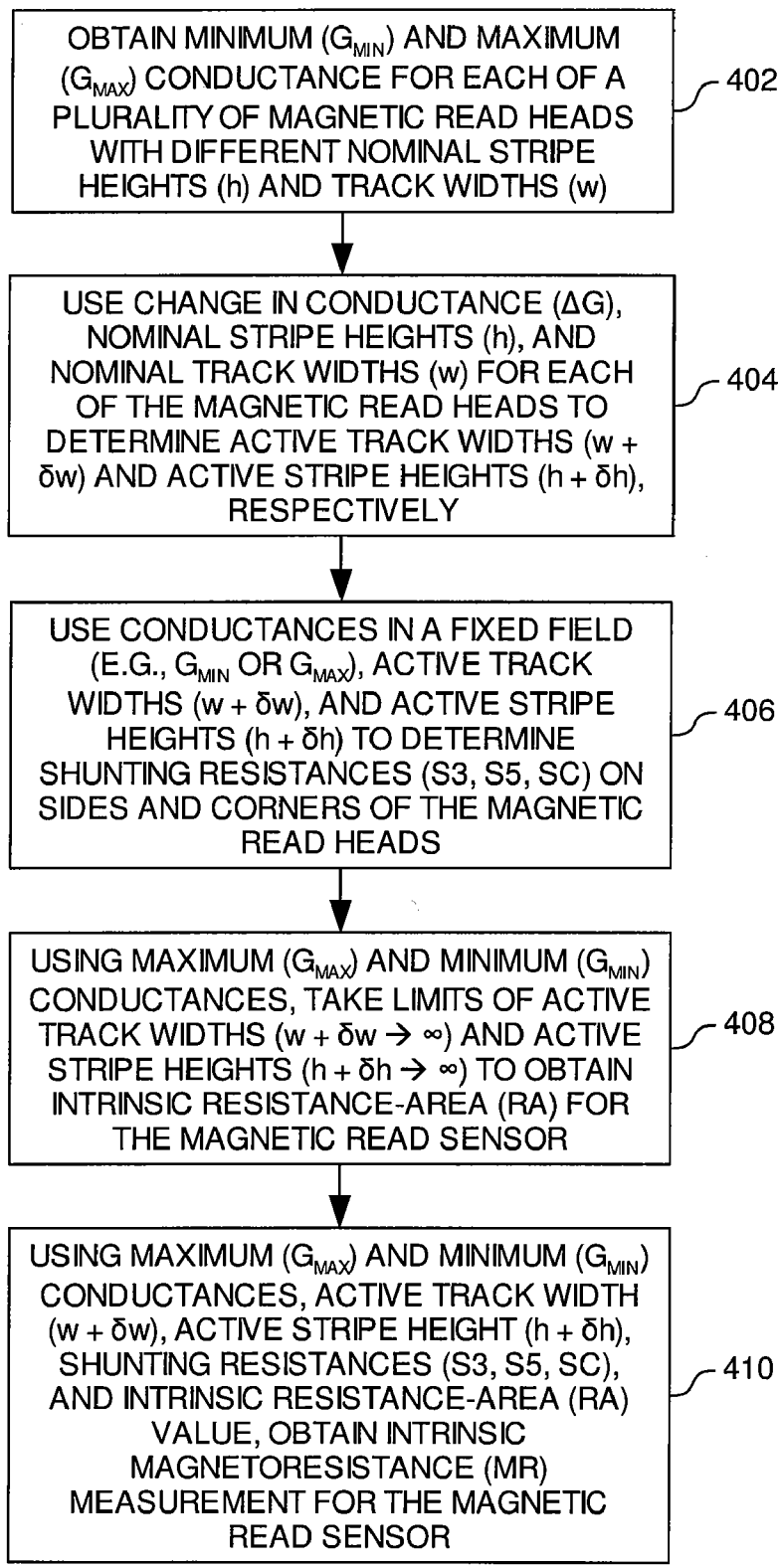
FIG. 4 is a flow diagram depicting an exemplary method for determining properties of a magnetic read head according to one embodiment of the invention.

FIG. 4 is a flow diagram depicting an exemplary method 400 for determining properties of the magnetic read head 200 according to one embodiment of the invention. The process 400 may begin at step 402 where the minimum conductance ($G_{MIN}$) and maximum conductance ($G_{MAX}$) for each of the plurality of magnetic read heads 360 with different nominal stripe heights (h) and track widths (w) is calculated. Then, at step 404, the change in conductance ($\Delta G=G_{MAX}-G_{MIN}$) along with the nominal stripe heights (h), and nominal track widths (w) may be used for each of the magnetic read heads to determine active track widths (w+δw) and active stripe heights (h+δh), respectively, for each of the plurality of magnetic read heads 360.

At step 406, conductances measured in a fixed field (e.g., $G_{MIN}$ or $G_{MAX}$), the active track widths (w+δw), and the active stripe heights (h+δh) may be used to determine shunting conductances ($S_{K3}$, $S_{K5}$, $S_C$) on sides and corners of the magnetic read heads. Then, at step 408 using the maximum ($G_{MAX}$) and minimum ($G_{MIN}$) conductances for each of the magnetic read heads 306, the limit of the active track widths (w+δw→∞) and active stripe heights (h+δh→∞) may be taken to obtain intrinsic resistance-area product (RA) for the magnetic read sensor 200.

At step 410, using the maximum ($G_{MAX}$) and minimum ($G_{MIN}$) conductances, active track width (w+δw), active stripe height (h+δh), shunting resistances ($S_{K3}$, $S_{K5}$, $S_C$), and intrinsic resistance-area (RA) value, the intrinsic magnetoresistance t may be obtained for the magnetic read head 200.

Figure 5:
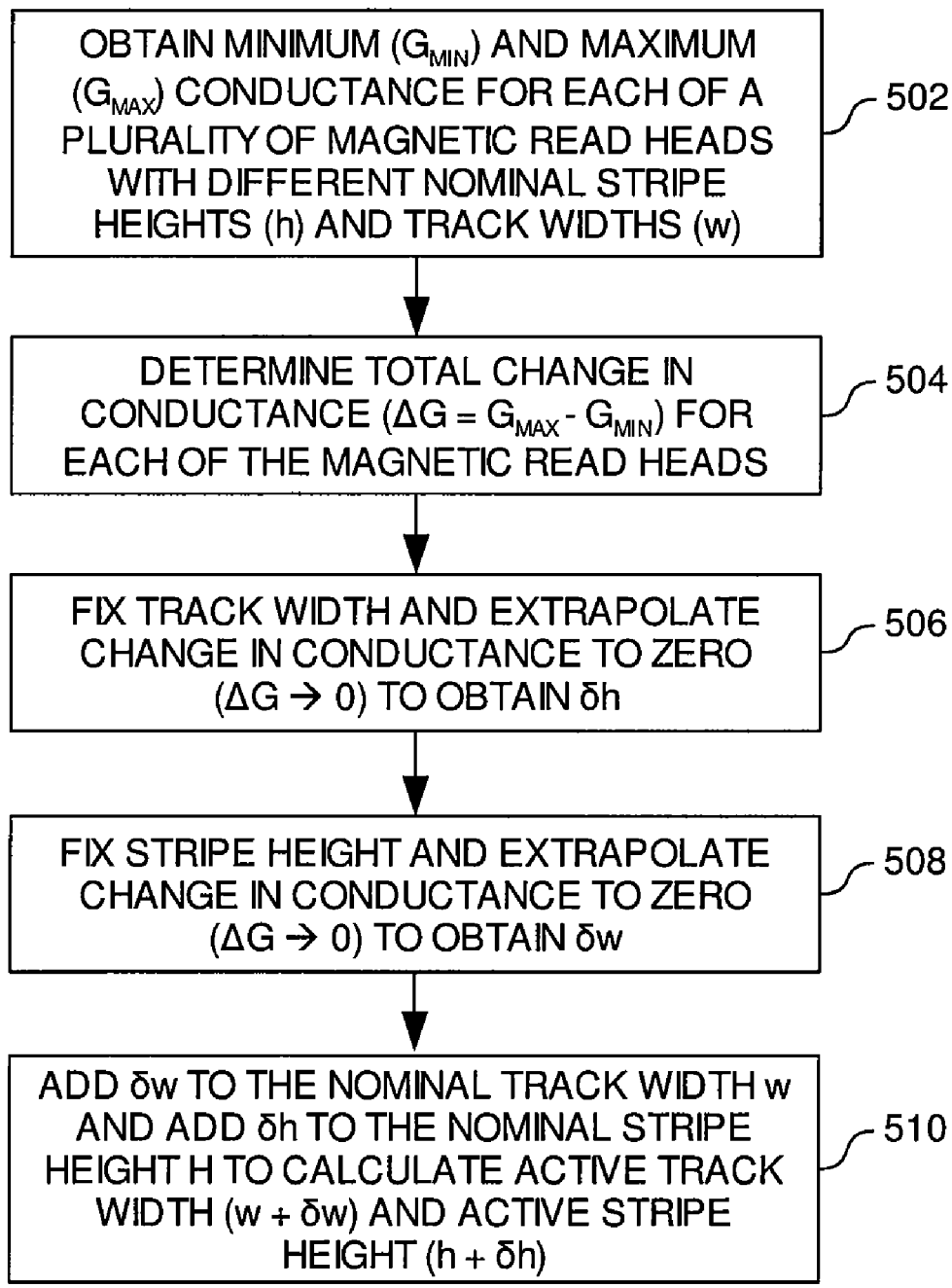
FIG. 5 is a flow diagram depicting a method for determining an active track width and/or active stripe height according to one embodiment of the invention.

The steps in the process 400 are described in greater detail below with respect to FIGS. 5-9002E Determining Active Track Width and/or Stripe Height of the Magnetic Read Head FIG. 5 is a flow diagram depicting a process 500 for determining an active track width and/or active stripe height of the magnetic read head 200 according to one embodiment of the invention. The process 500 may begin at step 502 where the minimum ($G_{MIN}$) and maximum ($G_{MAX}$) conductance is measured for each of the plurality of magnetic read heads 360. In one embodiment, the minimum and maximum conductances may be measured by using the measurement hardware 330 to vary the applied magnetic field 370 and measure the conductances via a change in voltage of the magnetic read heads 360 as described above.

At step 504, the total change in conductance ($\Delta G=G_{MAX}-G_{MIN}$) for each of the magnetic read heads 360 may be determined. Using Formulas 1 and 2 above, the change in conductance of the magnetic read heads 360 may be expressed as depicted below in Formula 5.

$$\Delta G = G_{MAX} - G_{MIN} = (w+\delta w)(h+\delta h) \times [t/(\rho^*(1+t))] \quad \text{Formula 5}$$

Figure 6:
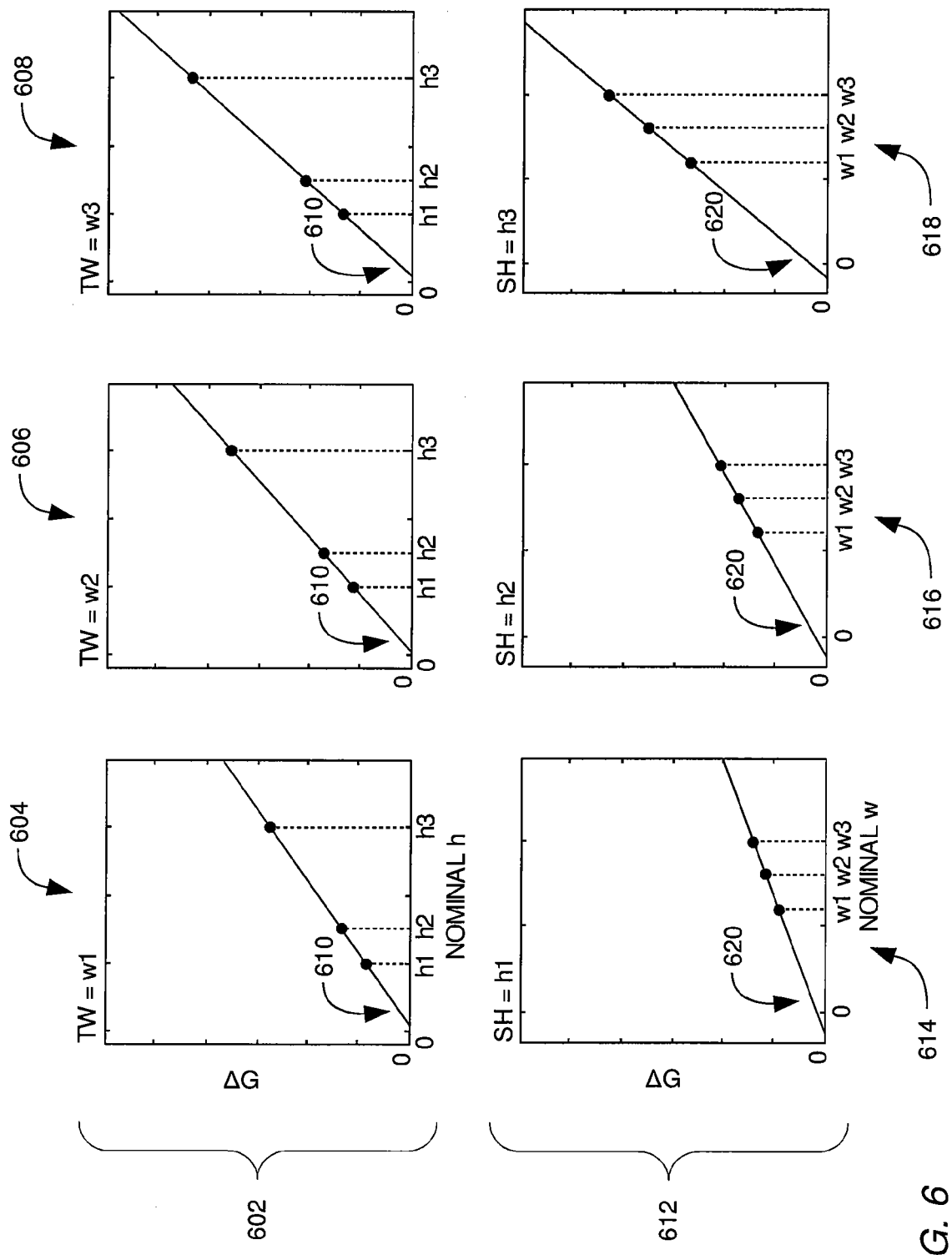
FIG. 6 is a diagram depicting exemplary graphs of magnetic read head properties used to measure the active track width and/or active stripe height according to one embodiment of the invention.

As depicted in Formula 5, by fixing the track width and extrapolating the change in conductance $\Delta G$ to 0 ($\Delta G \to 0$, where h=−δh), δh may be obtained (step 506). FIG. 6 depicts several graphs 602 showing the extrapolation 610 of change in conductance $\Delta G$ to zero for a fixed track width (w1, w2, and w3 for graphs 604, 606, and 608, respectively) to obtain δh. Similarly, at step 508, the stripe height may be fixed and the change in conductance may be extrapolated to zero ($\Delta G \to 0$, where w=−δw) to obtain the difference δw between the nominal and active track widths (step 504). FIG. 6 also depicts several graphs 612 showing the extrapolation 620 of the change in conductance $\Delta G$ to zero for a fixed stripe height (h1, h2, and h3 for graphs 614, 616, and 618, respectively) to obtain δw. By adding δw to the nominal track width w and adding δh to the nominal stripe height h, the active track width (w+δw) and active stripe height (h+δh) may be calculated at step 510.

Determining Shunting Resistances of the Magnetic Read Head

Figure 7:
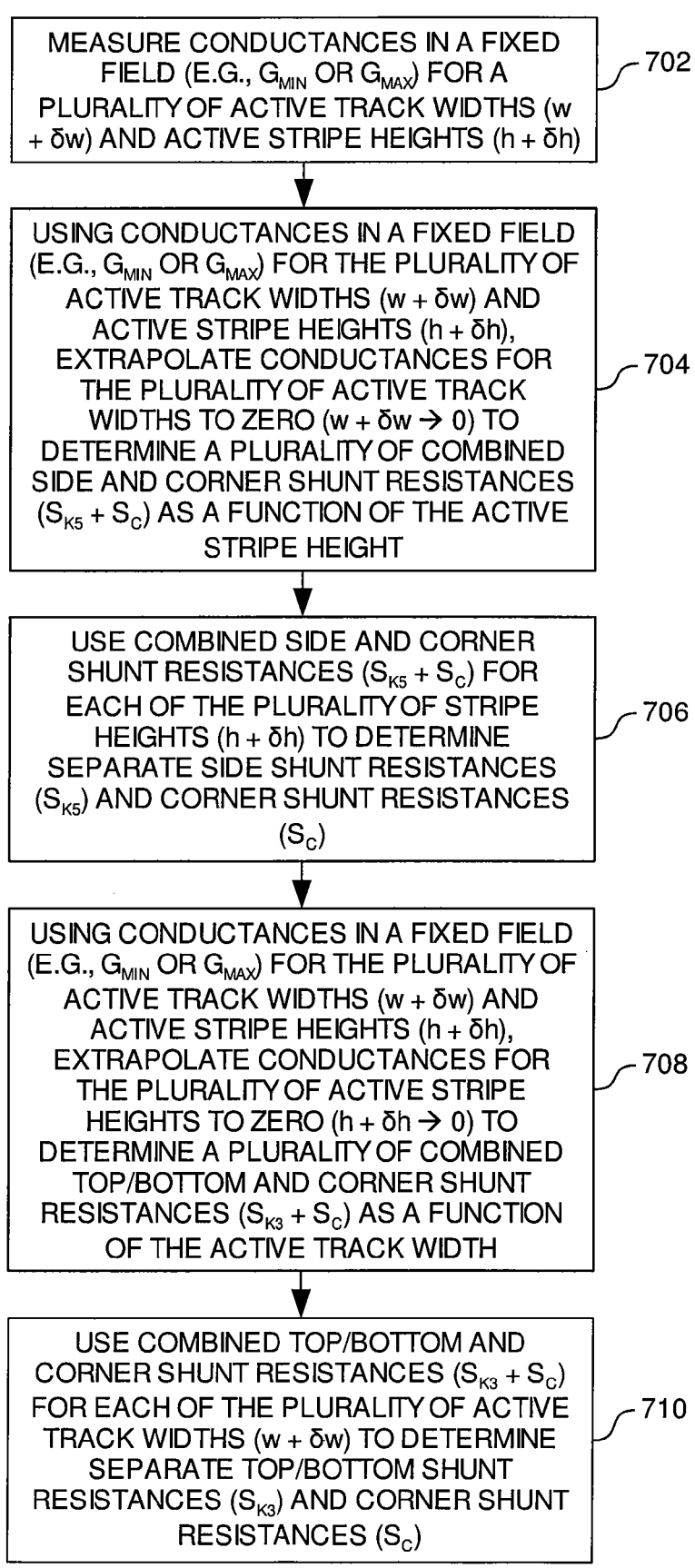
FIG. 7 is a flow diagram depicting a method for determining shunting resistances in a magnetic read head according to one embodiment of the invention.

FIG. 7 is a flow diagram depicting a process 700 for determining shunting conductances ($S_{K3}$, $S_{K5}$, $S_C$) in the magnetic read head 200 according to one embodiment of the invention. The process 700 may begin at step 702 where conductances in a fixed magnetic field (e.g., $G_{MIN}$ or $G_{MAX}$) for a plurality of active track widths (w+δw) and active stripe heights (h+δh) are measured. After measuring the conductances, the active track widths (w+δw) for each of the active stripe height may extrapolated to zero ((w+δw)→0) at step 704. As depicted, for example, in Formula 1, extrapolation of (w+δw) to zero causes the first term and $S_{K3}$ shunting terms in Formula 1 to be removed from the equation, thereby providing the remnant conductance as a function of the active stripe height as depicted in Formula 6 below.

$$G_{REM} = 2(h+\delta h)^* S_{K5} + 4S_C \quad \text{Formula 6}$$

Figure 8A:
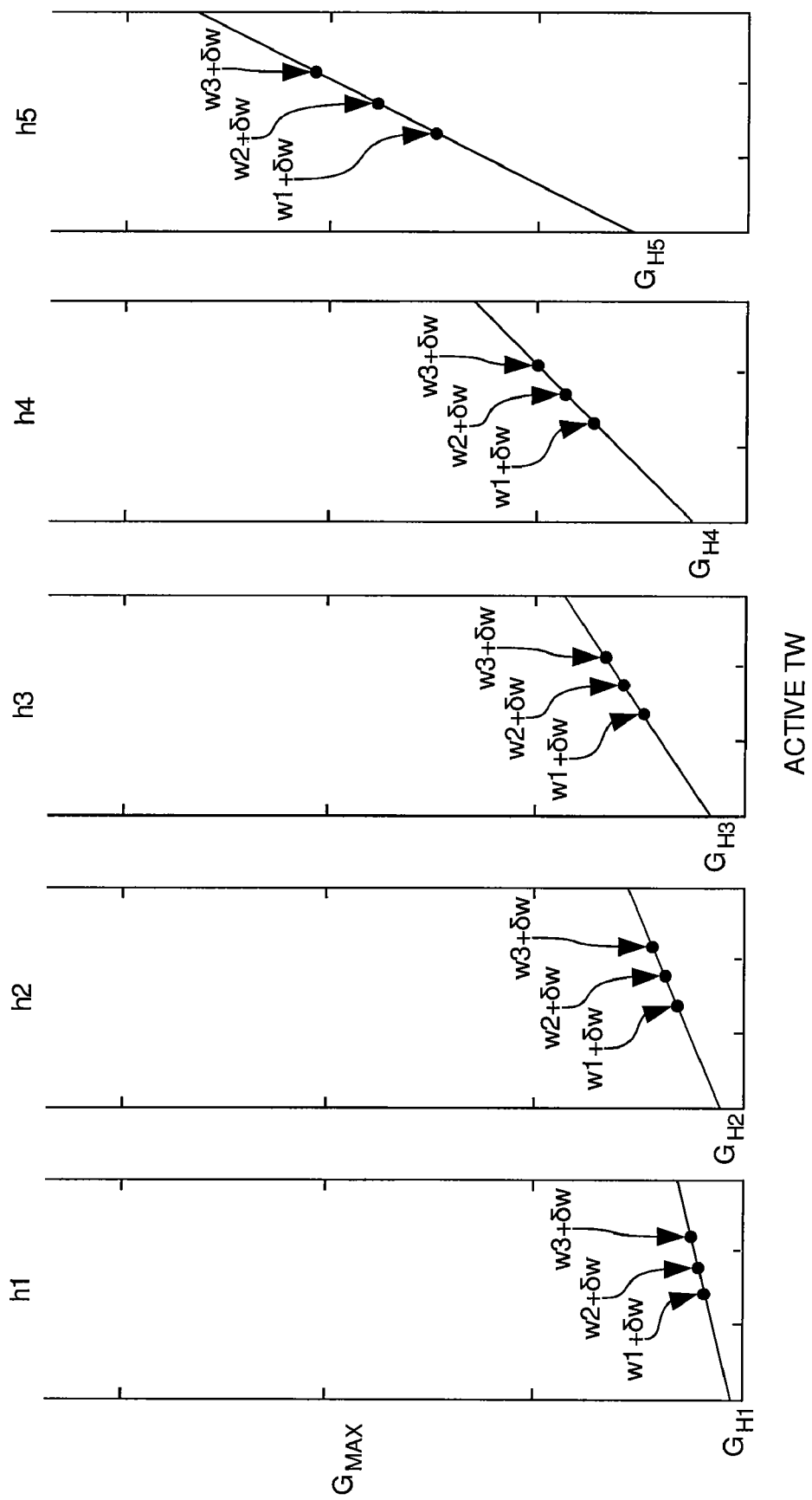
FIGS. 8A-C are diagrams depicting exemplary graphs of magnetic read head properties used to measure the shunting resistances in the magnetic read head according to one embodiment of the invention.

Extrapolation of (w+δw) to zero for multiple stripe height values (e.g., h1, h2, h3, etc.) to determine remnant conductances (e.g., $G_{H1}$, $G_{H2}$, $G_{H3}$, etc.) is depicted in FIG. 8A. Then, by graphing the remnant conductances for the plurality of active stripe heights as depicted in graph 804 of FIG. 8C, the $S_{K5}$ shunt term may be obtained from half of the slope ($2^*S_{K5}$) of the graph and the Sc shunt term may be obtained as one-quarter of the y-intercept (4 $S_C$) of the graph (step 706). Optionally, two measurements of $G_{REM}$ (e.g., $G_{H1}$, $G_{H2}$) for two different stripe heights (e.g., h1, h2) may be used to solve Formula 6 for the $S_{K5}$ and $S_C$ terms.

At step 708, using the conductances measured in a fixed magnetic field, the active stripe heights (h+δh) may be extrapolated to zero ((h+δh)→0). As depicted, for example, in Formula 1, extrapolation of (h+δh) to zero causes the first term and $S_{K5}$ shunting terms in Formula 1 to be removed from the equation, thereby providing the remnant conductance as a function of the active track width as depicted in Formula 7 below.

$$G_{REM} = 2(w+\delta w)^* S_{K3} + 4S_C \quad \text{Formula 7}$$

Figure 8B:
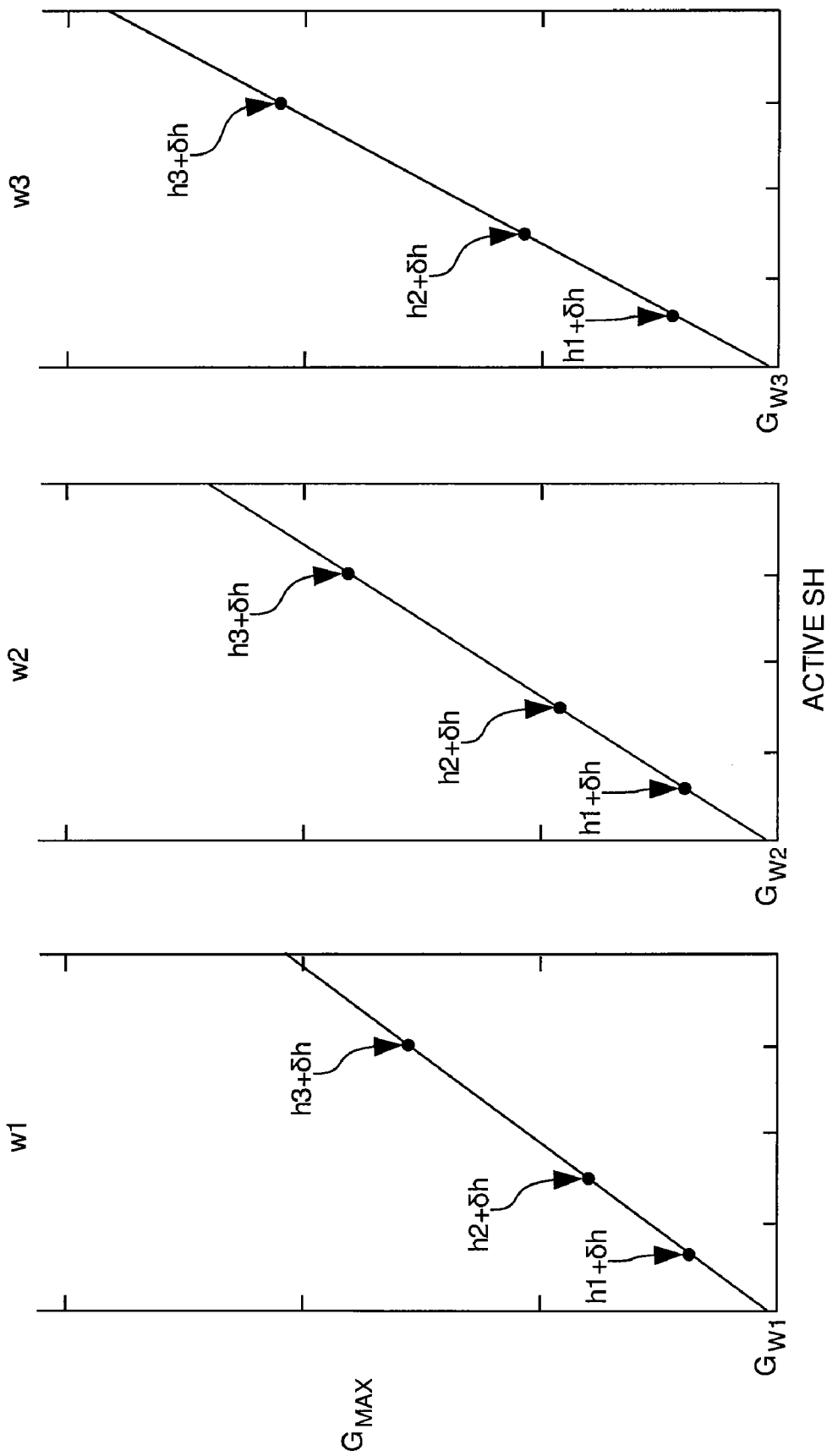
Figure 8C:
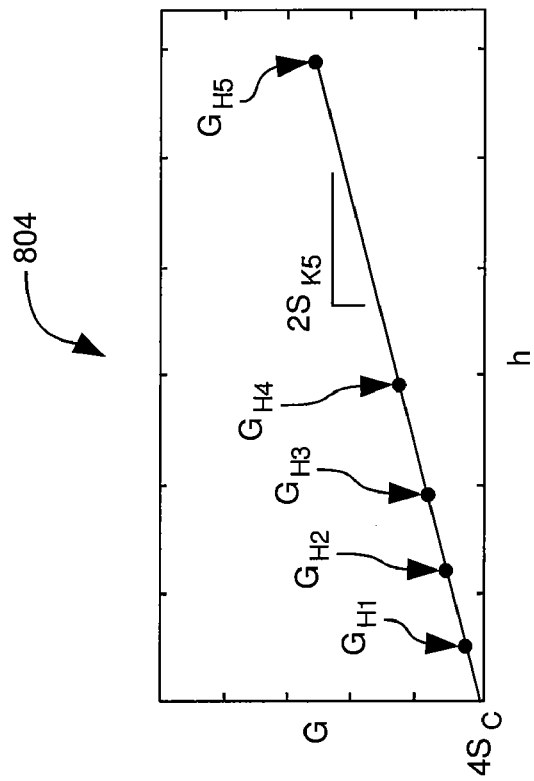
Figure 8C:
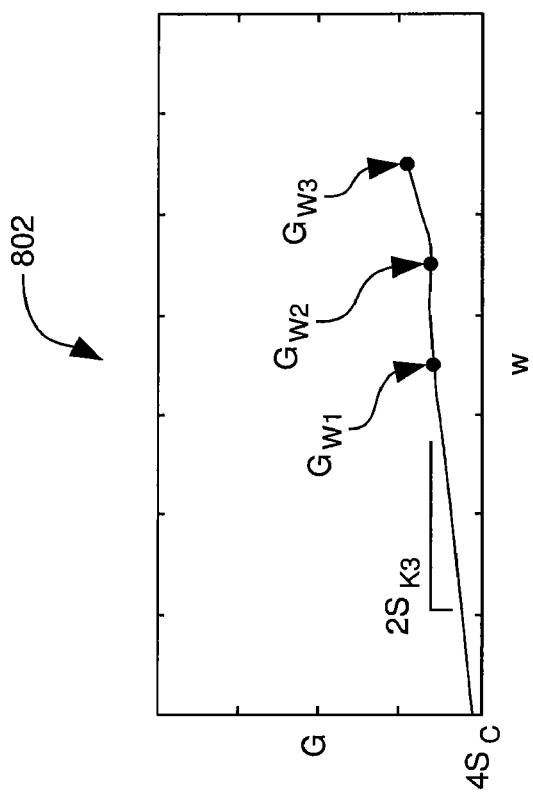

Extrapolation of (h+δh) to zero for multiple stripe height values (w1, w2, w3) to determine remnant conductances ($G_{W1}$, $G_{W2}$, $G_{W3}$, $G_{W4}$, $G_{W5}$) is depicted in FIG. 8B. By graphing the remnant conductances for the plurality of active track widths as depicted in graph 802 of FIG. 8C, the $S_{K5}$ shunt term may be obtained from half of the slope ($2^*S_{K3}$) of the graph and the Sc shunt term may be obtained as one-quarter of the y-intercept (4 $S_C$) of the graph (step 710). Optionally, two measurements of $G_{REM}$ (e.g., $G_{W1}$, $G_{W2}$) for two different track widths (e.g., w1, w2) may be used to solve Formula 7 for the $S_{K3}$ and $S_C$ terms.

Determining Intrinsic Resistance Properties of the Magnetic Read Head

FIG. 9 is a flow diagram depicting an exemplary method 900 for determining resistance properties of a magnetic read head according to one embodiment of the invention. The method 900 may begin at step 900 where the minimum conductance ($G_{MIN}$) and the maximum conductance ($G_{MAX}$) for the plurality of active track widths (w+δw) and active stripe heights (h+δh) are used to calculate the inverse of a percent change in conductance values ($G_{MIN}/\Delta G$) for each of the plurality of active track widths (w+δw) and active stripe heights (h+δh). As depicted in Formula 8, the percent change in conductance values, calculated from Formulas 1 and 2, may be expressed as:

$$G_{MIN}/\Delta G = (1/t) + [\rho(1+t)/t] \times [2S_{K3}/(h+\delta h) + 2S_{K5}/(w+\delta w) + 4S_C/((w+\delta w) \times (h+\delta h))] \quad \text{Formula 8}$$

As depicted above in Formula 8, the formula for $G_{MIN}/\Delta G$ provides a first term (1/t) and a second term ($\rho \times (1+t)/t$) multiplied by a shunting calculation. The first term (1/t) may be isolated and calculated by taking the limit as the active track width (w+δw) and active stripe height (h+δh) goes to infinity ((w+δw)→∞ and (h+δh)→∞), causing the shunting term to be removed from the equation. Accordingly, taking the limits allows the MR value t to be calculated as the inverse of the resulting conductance (t=ΔG/$G_{MIN}$). Thus, at step 904, the limit as the plurality of track widths approach infinity ((w+δw)→∞) and the limit as the plurality of stripe heights approach infinity ((h+δh)→∞) may be used to determine the intrinsic MR value (t) for the magnetic read head 200. As described above with respect to step 410 of process 400, after the active track width (w+δw), active stripe height (h+δh), shunting resistances ($S_{K3}$, $S_{K5}$, $S_C$), and intrinsic MR value (t) have been determined as described above, the intrinsic area-resistance value (ρ) for the magnetic read sensor may be determined by inserting each of the previously determine values into, for example, Formula 5 above and solving for the unknown (ρ).

Optionally, after the active track width (w+δw), active stripe height (h+δh), and shunting terms ($S_{K3}$, $S_{K5}$, and $S_C$) have been determined as described above, multiple measurements of $G_{MIN}$/ΔG may be used to solve Formula 8 for the two unknowns, ρ and t.

CONCLUSION

As described above, embodiments of the invention provide a method, computer-readable medium, and system for determining properties of a magnetic read head. In one embodiment, the method includes providing a first and a second magnetic read head. A first dimension of the first magnetic read head may be different from a corresponding first dimension of the second magnetic read head. The method further includes determining a first change in conductance of the first magnetic read head resulting from an applied magnetic field and a second change in conductance of the second magnetic read head resulting from the applied magnetic field. The first change in conductance and the second change in conductance may be used to determine a change in the first dimension and the corresponding first dimension of the first and second magnetic read heads, respectively. The change in the first dimension and the corresponding first dimension may result from a manufacturing process of the first and second magnetic read heads. By measuring multiple conductances for a plurality of magnetic read heads with a plurality of nominal widths and heights, the active track widths, active stripe heights, shunting conductances, intrinsic MR value, and intrinsic area-resistance value for the magnetic read head may be easily obtained in a calculation as described above.

While the foregoing is directed to embodiments of the present invention, other and further embodiments of the invention may be devised without departing from the basic scope thereof, and the scope thereof is determined by the claims that follow.

What is claimed is:

1. A method for measuring properties of a magnetic read head, the method comprising:
   providing a first and a second magnetic read head, wherein a first dimension of the first magnetic read head is different from a corresponding first dimension of the second magnetic read head;
   determining a first change in conductance of the first magnetic read head resulting from an applied magnetic field and a second change in conductance of the second magnetic read head resulting from the applied magnetic field; and
   using the first change in conductance and the second change in conductance to determine a change in the first dimension and the corresponding first dimension of the first and second magnetic read heads, respectively, wherein the change in the first dimension and the corresponding first dimension results from a manufacturing process of the first and second magnetic read heads.

2. The method of claim 1, wherein the first dimension of the first magnetic read head is a track width of the first magnetic read head and wherein the corresponding first dimension of the second magnetic read head is a track width of the second magnetic read head.

3. The method of claim 1, wherein the first dimension of the first magnetic read head is a stripe height of the first magnetic read head and wherein the corresponding first dimension of the second magnetic read head is a stripe height of the second magnetic read head.

4. The method of claim 1, wherein using the first change in conductance and the second change in conductance to determine a change in the first dimension and the corresponding first dimension comprises:
   determining a value corresponding to the change in the first dimension and the corresponding first dimension of the first and second magnetic read heads, respectively, at which a change in conductance of the magnetic read head is zero.

5. The method of claim 4, wherein determining the value comprises extrapolating the first change in conductance and the second change in conductance to the change in the first dimension and corresponding first dimension of the first and second magnetic read heads, respectively, at which the change in conductance of the first and second magnetic read heads is zero.

6. The method of claim 1, wherein the first change in conductance and the second change in conductance are changes in conductance between a minimum and a maximum conductance for the first and second magnetic read heads, respectively.

7. The method of claim 1, further comprising: providing a third magnetic read head and a fourth magnetic read head, wherein a corresponding second dimension of the third magnetic read and the fourth magnetic read head differs from a second dimension of the first and second magnetic read heads;
   determining a first, second, third, and fourth conductance of the first, second, third, and fourth magnetic read heads, respectively, in the applied magnetic field; determining a first shunt conductance value from the first and second conductance values, wherein a selected dimension of the first and second magnetic read heads at the first shunt conductance value is zero;
   determining a second shunt conductance value from the third and fourth conductance values, wherein a corresponding selected dimension of the third and fourth magnetic read heads at the second shunt conductance value is zero; and
   determining a lateral shunt conductance along the selected dimension and corresponding selected dimension of the first, second, third, and fourth magnetic read heads, respectively, and a corner shunt conductance from the first shunt conductance and the second shunt conductance.

8. The method of claim 7, wherein the first dimension and corresponding first dimension are an active track width of the first and second magnetic read heads, respectively, and wherein the second dimension and corresponding second dimension of are an active stripe height of the first, second, third, and fourth magnetic read heads, respectively, and wherein the lateral shunt conductance is a shunt conductance along lateral sides of the first, second, third, and fourth magnetic read heads, respectively.

9. The method of claim 7, wherein the first dimension and corresponding first dimension are active stripe heights of the first and second magnetic read heads, respectively, and wherein the second dimension and corresponding second dimension are an active track widths of the first, second, third, and fourth magnetic read heads, respectively, and wherein the lateral shunt conductance is a shunt conductance along a top side and a bottom side of the first, second, third, and fourth magnetic read heads, respectively.

10. The method of claim 1, further comprising:
providing a plurality of magnetic read heads with a plurality of active track widths and a plurality of active stripe heights;
determining a maximum and a minimum conductance for each of the plurality of magnetic read heads;
calculating a plurality of conductance values corresponding to the minimum conductance divided by a change in conductance between the minimum and maximum conductance for each of the plurality of magnetic read heads; and
calculating a conductance value of the plurality of magnetic read heads by taking a limit of the plurality of conductance values as the plurality of active track widths and the plurality of active stripe heights approach infinity.

11. A computer readable medium including instructions which, when executed by a processor, perform a method for measuring properties of a magnetic read head, the method comprising:
receiving test data for a first and a second magnetic read head, wherein a first dimension of the first magnetic read head is different from a corresponding first dimension of the second magnetic read head;
determining from the test data a first change in conductance of the first magnetic read head resulting from an applied magnetic field and a second change in conductance of the second magnetic read head resulting from the applied magnetic field; and
using the first change in conductance and the second change in conductance to determine a change in the first dimension and the corresponding first dimension of the first and second magnetic read heads, respectively, wherein the change in the first dimension and the corresponding first dimension results from a manufacturing process of the first and second magnetic read heads.

12. The computer readable medium of claim 11, wherein the first dimension of the first magnetic read head is a track width of the first magnetic read head and wherein the corresponding first dimension of the second magnetic read head is a track width of the second magnetic read head.

13. The computer readable medium of claim 11, wherein the first dimension of the first magnetic read head is a stripe height of the first magnetic read head and wherein the corresponding first dimension of the second magnetic read head is a stripe height of the second magnetic read head.

14. The computer readable medium of claim 11, wherein using the first change in conductance and the second change in conductance to determine a change in the first dimension and the corresponding first dimension comprises:
determining a value corresponding to the change in the first dimension and the corresponding first dimension of the first and second magnetic read heads, respectively, at which a change in conductance of the magnetic read head is zero.

15. The computer readable medium of claim 11, wherein the method further comprises:
receiving additional data with the test data for a third magnetic read head and a fourth magnetic read head, wherein a corresponding second dimension of the third magnetic read and the fourth magnetic read head differs from a second dimension of the first and second magnetic read heads;
determining from the test data a first, second, third, and fourth conductance of the first, second, third, and fourth magnetic read heads, respectively, in the applied magnetic field;
determining a first shunt conductance value from the first and second conductance values, wherein a selected dimension of the first and second magnetic read heads at the first shunt conductance value is zero;
determining a second shunt conductance value from the third and fourth conductance values, wherein a corresponding selected dimension of the third and fourth magnetic read heads at the second shunt conductance value is zero; and
determining a lateral shunt conductance along the selected dimension and corresponding selected dimension of the first, second, third, and fourth magnetic read heads, respectively, and a corner shunt conductance from the first shunt conductance and the second shunt conductance.

16. The computer readable medium of claim 11, wherein the method further comprises:
determining from the test data a maximum and a minimum conductance for a plurality of magnetic read heads with a plurality of active track widths and a plurality of active stripe heights;
calculating a plurality of conductance values corresponding to the minimum conductance divided by a change in conductance between the minimum and maximum conductance for each of the plurality of magnetic read heads; and
calculating a conductance value of the plurality of magnetic read heads by taking a limit of the plurality of conductance values as the plurality of active track widths and the plurality of active stripe heights approach infinity.

17. A system, comprising:
a computer readable medium including a program; and
a processor which, when executing the program, is configured to:
receive test data for a first and a second magnetic read head, wherein a first dimension of the first magnetic read head is different from a corresponding first dimension of the second magnetic read head;
determine from the test data a first change in conductance of the first magnetic read head resulting from an applied magnetic field and a second change in conductance of the second magnetic read head resulting from the applied magnetic field; and
use the first change in conductance and the second change in conductance to determine a change in the first dimension and the corresponding first dimension of the first and second magnetic read heads, respectively, wherein the change in the first dimension and the corresponding first dimension results from a manufacturing process of the first and second magnetic read heads.

18. The system of claim 17, wherein the first dimension of the first magnetic read head is a track width of the first magnetic read head and wherein the corresponding first dimension of the second magnetic read head is a track width of the second magnetic read head.

19. The system of claim 17, wherein the first dimension of the first magnetic read head is a stripe height of the first magnetic read head and wherein the corresponding first dimension of the second magnetic read head is a stripe height of the second magnetic read head.

20. The system of claim 17, wherein using the first change in conductance and the second change in conductance to determine a change in the first dimension and the corresponding first dimension comprises:

determining a value corresponding to the change in the first dimension and the corresponding first dimension of the first and second magnetic read heads, respectively, at which a change in conductance of the first and second magnetic read heads is zero.

21. The system of claim 17, wherein the processor is further configured to:

receive additional data with the test data for a third magnetic read head and a fourth magnetic read head, wherein a corresponding second dimension of the third magnetic read and the fourth magnetic read head differs from a second dimension of the first and second magnetic read heads;

determine from the test data a first, second, third, and fourth conductance of the first, second, third, and fourth magnetic read heads, respectively, in the applied magnetic field;

determine a first shunt conductance value from the first and second conductance values, wherein a selected dimension of the first and second magnetic read heads at the first shunt conductance value is zero;

determine a second shunt conductance value from the third and fourth conductance values, wherein a corresponding selected dimension of the third and fourth magnetic read heads at the second shunt conductance value is zero; and determine a lateral shunt conductance along the selected dimension and corresponding selected dimension of the first, second, third, and fourth magnetic read heads, respectively, and a corner shunt conductance from the first shunt conductance and the second shunt conductance.

22. The system of claim 17, wherein the processor is further configured to:

determine from the test data a maximum and a minimum conductance for a plurality of magnetic read heads with a plurality of active track widths and a plurality of active stripe heights; and calculate a plurality of conductance values corresponding to the minimum conductance divided by a change in conductance between the minimum and maximum conductance for each of the plurality of magnetic read heads.

23. The system of claim 17, wherein the processor is further configured to:

calculate a film-intrinsic tunneling magnetoresistive value for the plurality of magnetic read heads by taking a limit of the plurality of conductance values as the plurality of active track widths and the plurality of active stripe heights approach infinity.

24. The system of claim 23, wherein the processor is further configured to:

use the calculated film-intrinsic tunneling magnetoresistive value to calculate a resistance-area product value of the plurality of magnetic read heads.

* * * * *